United States Patent
Ma et al.

(10) Patent No.: US 8,759,937 B2
(45) Date of Patent: Jun. 24, 2014

(54) SCHOTTKY JUNCTION DIODE DEVICES IN CMOS WITH MULTIPLE WELLS

(75) Inventors: Yanjun Ma, Bellevue, WA (US);
Ronald A. Oliver, Seattle, WA (US);
Todd E. Humes, Shoreline, WA (US);
Jaideep Mavoori, Bellevue, WA (US)

(73) Assignee: Synopsys, Inc., Mountain View, CA (US)

( * ) Notice: Subject to any disclaimer, the term of this patent is extended or adjusted under 35 U.S.C. 154(b) by 959 days.

(21) Appl. No.: 11/387,515

(22) Filed: Mar. 22, 2006

(65) Prior Publication Data

US 2006/0223246 A1 Oct. 5, 2006

Related U.S. Application Data

(60) Provisional application No. 60/667,109, filed on Mar. 30, 2005.

(51) Int. Cl.
| | | |
|---|---|---|
| *H01L 27/095* | (2006.01) | |
| *H01L 29/872* | (2006.01) | |
| *H01L 29/66* | (2006.01) | |
| *H01L 27/06* | (2006.01) | |

(52) U.S. Cl.
CPC ........ *H01L 29/872* (2013.01); *H01L 29/66143* (2013.01); *H01L 27/0629* (2013.01)
USPC ........... 257/484; 257/476; 257/483; 257/547; 257/548

(58) Field of Classification Search
CPC ............ H01L 27/0629; H01L 27/0814; H01L 29/66143; H01L 29/872
USPC .......... 257/371, E21.359, E21.368, E29.338, 257/471–486, 544–551

See application file for complete search history.

(56) References Cited

U.S. PATENT DOCUMENTS

| | | | | |
|---|---|---|---|---|
| 4,757,363 A * | 7/1988 | Bohm et al. | ................... | 257/358 |
| 5,153,699 A * | 10/1992 | Shirotori et al. | ............... | 257/208 |
| 5,828,110 A * | 10/1998 | Wollesen | ....................... | 257/373 |
| 5,885,876 A * | 3/1999 | Dennen | ......................... | 438/294 |
| 5,889,309 A * | 3/1999 | Yu et al. | ........................ | 257/363 |
| 5,962,893 A | 10/1999 | Omura et al. | | |
| 6,274,909 B1 * | 8/2001 | Chang et al. | ................... | 257/355 |
| 6,784,489 B1 * | 8/2004 | Menegoli | ....................... | 257/343 |
| 7,202,536 B2 | 4/2007 | Williams et al. | | |

(Continued)

OTHER PUBLICATIONS

Office Action for U.S. Appl. No. 11/387,603 mailed Jun. 23, 2008.

(Continued)

*Primary Examiner* — Ori Nadav
(74) *Attorney, Agent, or Firm* — Fenwick & West LLP

(57) ABSTRACT

A Schottky junction diode device having improved performance and a multiple well structure is fabricated in a conventional CMOS process. A substrate including a material doped to a first conductivity type is formed. A first well is disposed over the substrate. The first well includes a material doped differently, such as to a second conductivity type opposite that of the first conductivity type. A second well is disposed within the first well. A region of metal-containing material is disposed in the second well to form a Schottky junction at an interface between the region of metal-containing material and the second well. In one embodiment, a second well contact is disposed in a portion of the second well.

33 Claims, 2 Drawing Sheets

(56) References Cited

U.S. PATENT DOCUMENTS

| | | | |
|---|---|---|---|
| 7,602,018 B2 * | 10/2009 | Iida | 257/339 |
| 2004/0012066 A1 * | 1/2004 | Dietl et al. | 257/471 |
| 2006/0125040 A1 | 6/2006 | Levin et al. | |
| 2006/0223247 A1 | 10/2006 | Ma et al. | |

OTHER PUBLICATIONS

Office Action for U.S. Appl. No. 11/387,603 mailed Jan. 8, 2009.
Office Action for U.S. Appl. No. 11/387,603 mailed Aug. 4, 2009.

* cited by examiner

US 8,759,937 B2

SCHOTTKY JUNCTION DIODE DEVICES IN CMOS WITH MULTIPLE WELLS

STATEMENT OF RELATED CASES

This patent application claims priority from U.S. Provisional Patent Application Ser. No. 60/667,109 filed on Mar. 30, 2005 and entitled "Schottky Diodes in CMOS" in the names of the same inventors and commonly owned herewith.

This patent application may also be considered to be related to U.S. patent application Ser. No. 11/387,603 filed on even date herewith and entitled "Schottky Junction Diode Devices in CMOS", in the names of the same inventors and commonly owned herewith. That patent application claims priority from United States Provisional Patent Application Ser. No. 60/667,110 filed on Mar. 30, 2005 and entitled "Schottky Diodes in CMOS" in the names of the same inventors and commonly owned herewith.

FIELD OF THE INVENTION

The present invention relates generally to the field of semiconductors. More specifically, the present invention relates to Schottky junction diode devices fabricated in complementary metal oxide semiconductor (CMOS) fabrication processes and methods for carrying out such processes.

BACKGROUND OF THE INVENTION

Schottky diodes have been widely used in high frequency integrated circuits because of their unique capabilities for fast switching with a low voltage drop. Many semiconductor devices have employed Schottky junction diode devices because of their unique characteristics. Instead of a semiconductor to semiconductor junction as a barrier in a conventional semiconductor diode, the Schottky junction diode device uses a metal to semiconductor junction, also known as Schottky junction, as its barrier. Since conventional complementary metal oxide semiconductor (CMOS) integrated circuits generally do not employ Schottky junction diodes, Schottky junction diodes are not known to be available in standard CMOS semiconductor fabrication processes. Schottky junction diodes of the prior art require specialized semiconductor fabrication processes.

FIG. 1 is an elevational cross-sectional drawing illustrating a conventional Schottky junction diode device 100 formed in silicon (Si) in accordance with the prior art. Device 100 includes a p– substrate 102, an n– well 104 and a p– well 106. A metal-containing layer 108 is formed in contact with n– well 104 to form a Schottky junction 110 at the interface between the metal-containing layer 108 and the silicon of n– well 104. The p– well 106 is contacted or substantially contacted to n– well 104 at interface 112. A substrate contact 114 is provided for the device at p– well 106. Substrate contact 114 is used for biasing the substrate. One or more n– well contacts 116a, 116b are provided at n– well 104. The Schottky junction diode is defined between metal-containing layer 108 and n– well contact 116a or 116b. A drawback associated with this conventional approach is that there is a relatively high capacitance created between the wells 104 and 106 which limits the performance of the Schottky junction diode device 100.

Therefore, there is a need in the art to improve Schottky junction diode devices so that they may exhibit higher performance and be fabricated in conventional CMOS process environments.

SUMMARY OF THE INVENTION

A Schottky junction diode device having improved performance and a multiple well structure is fabricated in a conventional CMOS process. A substrate including a material doped to a first conductivity type is formed. A first well is disposed over the substrate. The first well includes a material doped differently, such as to a second conductivity type opposite that of the first conductivity type. A second well is disposed within the first well. A region of metal-containing material is disposed in the second well to form a Schottky junction at an interface between the region of metal-containing material and the second well. In one embodiment, a second well contact is disposed in a portion of the second well.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
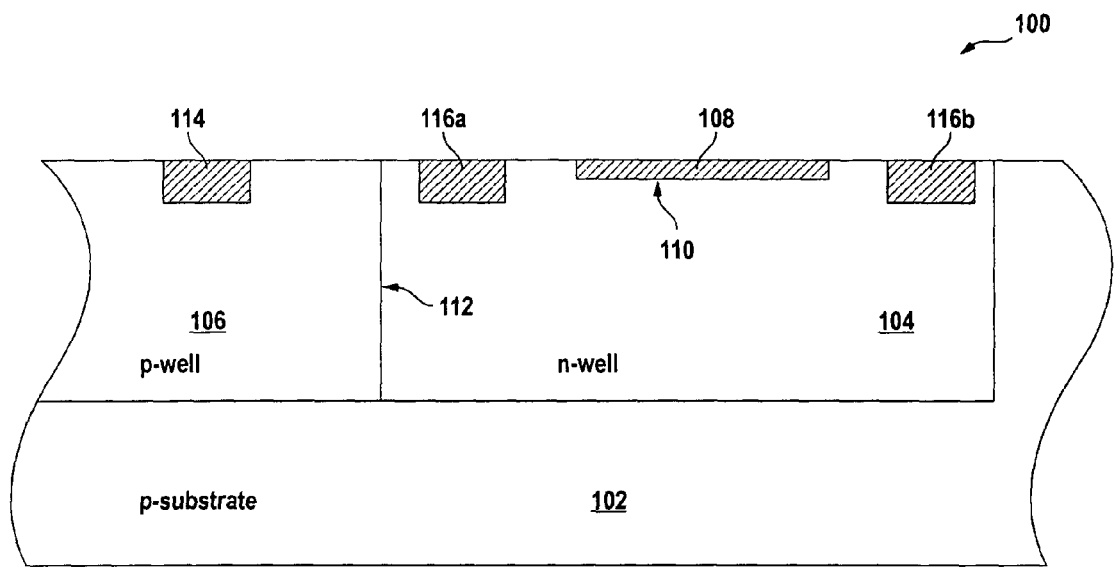
FIG. 1 is an elevational cross-sectional drawing illustrating a conventional Schottky junction diode structure in accordance with the prior art.

Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{20}$ atoms per cubic centimeter or more. The symbol n− indicates an n-doped semiconductor material (such a silicon (Si), germanium (Ge), Gallium Arsenide (GaAs), and the like) typically having a doping level on the order of $10^{17}$ atoms per cubic centimeter for n− doped wells and on the order of $10^{15}$ atoms per cubic centimeter for n− substrate material. The symbol p+ indicates a p-doped semiconductor material typically having a doping level of p-type dopants on the order of $10^{20}$ atoms per cubic centimeter or more. The symbol p− indicates a p-doped semiconductor material typically having a doping level on the order of $10^{17}$ atoms per cubic centimeter for p− doped wells and on the order of $10^{15}$ atoms per cubic centimeter for p− substrate material. Those of ordinary skill in the art will now realize that a range of doping concentrations around those described above will also work. Furthermore, the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Essentially, any process capable of forming pFETs and nFETs will work. Doped regions may be diffusions or they may be implanted. When it is said that something is doped at approximately the same level as something else, the doping levels are within a factor of ten of each other, e.g., $10^{16}$ is within a factor of ten of $10^{15}$ and $10^{17}$.

In accordance with an embodiment of the present invention, an improved Schottky junction diode device is fabricated in a conventional CMOS process and exhibits improved performance through reduced junction capacitance. In one embodiment, a Schottky junction diode device comprises a metal-pSi Schottky diode having multiple wells to reduce the junction capacitance. This embodiment introduces a technique for fabricating such Schottky junction diode devices with multiple wells in a conventional CMOS process. In one embodiment, a first well is disposed over a first region of a substrate and a second well is disposed within the first well. A region of metal-containing material (which may be in the form of a layer or another structure) is disposed within a portion of the second well to form a Schottky junction at an interface between the metal-containing material and the second well. Optionally, a third well is disposed over a second region of the substrate wherein the first well and the third well are separated from one another by a region of the substrate.

Figure 2:
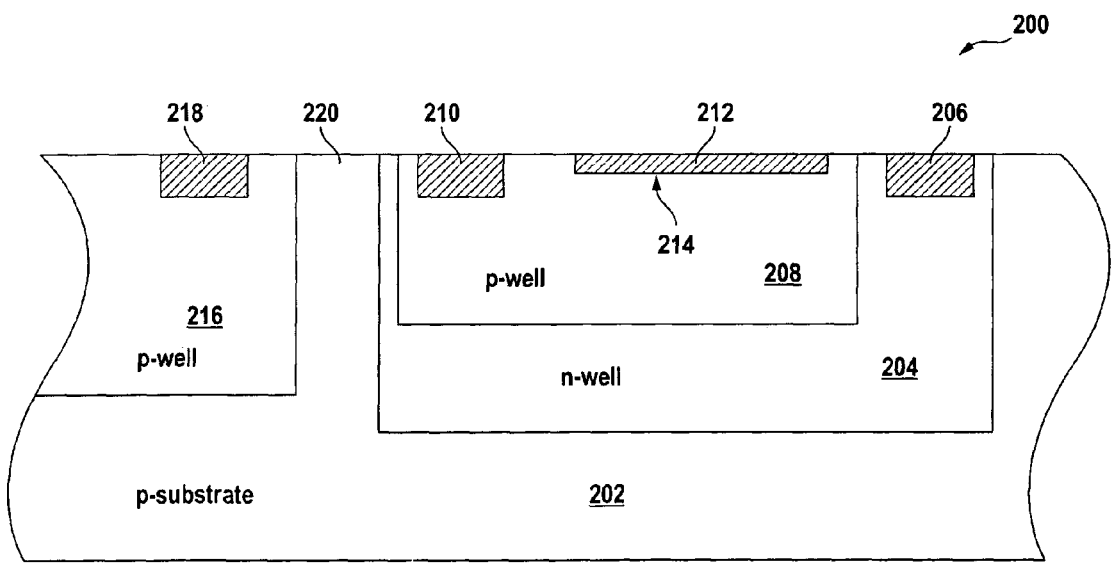
FIG. 2 is an elevational cross-sectional drawing illustrating a Schottky junction diode device in accordance with one embodiment of the present invention.

FIG. 2 is a cross-sectional drawing illustrating a Schottky junction diode device 200 in accordance with one embodiment of the present invention. In this embodiment, which may be fabricated using a conventional CMOS process in silicon, device 200 includes a substrate 202 formed of a semiconductor material doped to a first conductivity type. In one embodiment the first conductivity type is p−.

A first well 204 is disposed over a first region of substrate 202. First well 204 comprises a semiconductor material doped to a second conductivity type opposite to the first conductivity type. In one embodiment the second conductivity type is n−.

First well 204 may be provided with one or more electrically conductive first well contacts 206 useful for providing a bias signal to the first well. These contacts may be point contacts (e.g., small compared to the size of the first well and of a shape that is round, rectangular, square or the like) and may be formed of any suitable conductive material as would be known to those of ordinary skill in the art. Such materials include one or a combination of any of: p+ doped or n+ doped semiconductor (such as heavily doped polysilicon, for example), titanium, titanium silicide, cobalt, cobalt silicide, nickel, nickel silicide, tungsten, tungsten silicide, gold, manganese, hafnium, silver, aluminum, palladium or platinum. Alternatively, the first well contact 206 may be disposed in other shapes such as a line or a closed loop on the surface of device 200 (such as a rectangle, square, circle or the like) which may surround the metal-containing region 212 (see below).

A second well 208 is formed within first well 204. Second well 208 is formed of a semiconductor material doped to the first conductivity type.

Second well 208 is provided with one or more electrically conductive second well contacts 210. These contacts may be point contacts (e.g., small compared to the size of the first well and of a shape that is round, rectangular, square or the like) and may be formed of any suitable conductive material as would be known to those of ordinary skill in the art. Such materials include one or a combination of any of: p+ doped or n+ doped semiconductor (such as heavily doped polysilicon, for example), titanium, titanium silicide, cobalt, cobalt silicide, nickel, nickel silicide, tungsten, tungsten silicide, gold, manganese, hafnium, silver, aluminum, palladium or platinum. Alternatively, the second well contact 210 may be disposed in other shapes such as a line or a closed loop on the surface of device 200 (such as a rectangle, square, circle or the like) which may surround the metal-containing region 212 (see below).

A region of metal-containing material 212 (Schottky contact) is disposed within second well 208 to form a Schottky junction at an interface 214 between the region of metal-containing material 212 and second well 208. The region of metal-containing material 212 may comprise one or more of the following materials: titanium, titanium silicide, cobalt, cobalt silicide, nickel, nickel silicide, tungsten, tungsten silicide, gold, manganese, hafnium, silver, aluminum, palladium or platinum. The Schottky junction diode device is defined between the region of metal-containing material 212 and second well contact 210. Note that an oxide may be formed or deposited along the surface of the substrate 202. In addition, the oxide may end up disposed between the region of metal containing material 212 and second well contact 210.

Optionally, a third well 216 is formed over a second region of substrate 202. Third well 216 may be provided, for example, to provide a bias signal to the substrate 202. Third well 216 is formed of a semiconductor material doped to the second conductivity type.

Third well 216 is provided with one or more electrically conductive third well contacts 218. These contacts may be point contacts (e.g., small compared to the size of the first well and of a shape that is round, rectangular, square or the like) and may be formed of any suitable conductive material as would be known to those of ordinary skill in the art. Such materials include one or a combination of any of: p+ doped or n+ doped semiconductor (such as heavily doped polysilicon, for example), titanium, titanium silicide, cobalt, cobalt silicide, nickel, nickel silicide, tungsten, tungsten silicide, gold, manganese, hafnium, silver, aluminum, palladium or platinum. Alternatively, the third well contact 218 may be disposed in other shapes such as a line or a closed loop on the surface of device 200 (such as a rectangle, square, circle or the like) which may surround the metal-containing region 212.

In one embodiment, third well 216 is configured to avoid direct contact with first well 204. A region 220 of substrate 202 is disposed between first well 204 and third well 216. Although substrate 202 and third well 216 are both of the same conductivity type, such as p− type, their dopant concentrations are different as pointed out above. An advantage of having such a three-well configuration is to further improve the performance of the Schottky junction diode devices by further reducing capacitance. This is achieved in part because a region of first well 204 is disposed between second well 208 and third well 216. The addition of region 220 to this separation further enhances performance.

Figure 3:
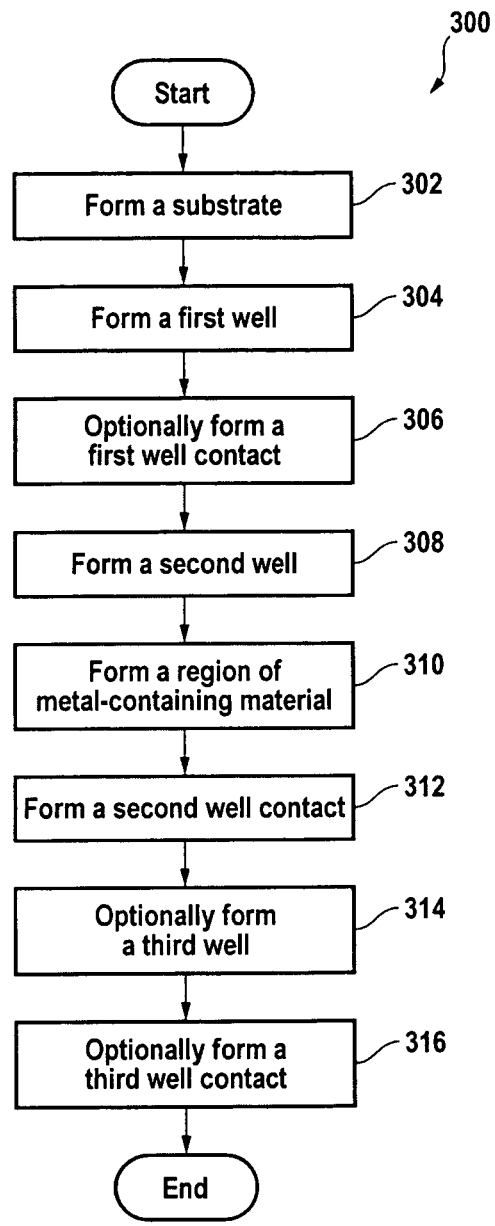
FIG. 3 is a flowchart illustrating a method for manufacturing Schottky junction diode devices in a CMOS process in accordance with one embodiment of the present invention.

FIG. 3 is a flowchart illustrating a method or process 300 for manufacturing Schottky junction diode devices using multiple wells in a conventional CMOS process in accordance with one embodiment of the present invention. At block 302, the process forms a substrate that includes a material doped to a first conductivity type. In one embodiment, the material doped to the first conductivity type is p– doped semiconductor material (p– material). In another embodiment, the material doped to a first conductivity type is n– semiconductor material (n– material). The p– material, in one example, includes silicon (Si). In another example, the p– doped material includes germanium (Ge), gallium arsenide (GaAs) or another suitable semiconductor material. Once the substrate is properly doped and formed, the process moves to the next block. Such substrate materials may be purchased from fabricators thereof.

At block 304, the process disposes a first well over a first region of the substrate. The first well includes a material doped to a second conductivity type opposite to that of the first conductivity type. For example, if the substrate is a p– material, the first well would be an n– material. After the first well is formed or deposited, the process moves to the next block.

At block 306 a first well contact is optionally formed as described in more detail above.

At block 308, the process disposes a second well within the first well. The second well includes a material doped to a first conductivity type. For example, the second well may comprise p– material (p– well), which is formed or deposited within the first well (n– well). In another embodiment, the second well is an n– well that is disposed within the first n– well wherein the n– dopant concentrations between the second well and the first well are different. After formation of the second well, the process moves to the next block.

At block 310, the process disposes a region of metal-containing material 212 within the second well 208 to create a Schottky junction 214 at an interface between the region of metal-containing material 212 and the second well 208. In one embodiment, a region of metal-containing material 212 is disposed in a portion of the second well 208 to create a metal-semiconductor (Schottky) junction 214. The region of metal-containing material 214 includes metal materials as described above. The process moves to the next block.

At block 312, the process disposes a second well contact 210 as an electrical contact in the second well 208 as described in more detail above. After the deposition of the second well contact, the process moves to the next block.

At block 314, the process optionally disposes a third well of the first conductivity type over the substrate. In one embodiment, the third well is a p– type semiconductor material while the substrate is also a p– type semiconductor material. The concentration of p– dopants in the third well material, however, is different from the concentration of p– dopants in the substrate, as described in more detail above. In one embodiment the third well is formed or configured so that it does not contact, touch, or overlap with the first well 204 or the second well 208. In one embodiment, a region of the substrate 220 is disposed between the first well 204 and the third well 216 to separate the first well 204 from the third well 216.

At block 316, the process optionally disposes a third well contact 218 as an electrical contact in the third well 216 as described in more detail above. After the deposition of the third well contact, the process is complete.

Those of ordinary skill in the art will now realize that some of the process steps described above may be performed in different sequences or simultaneously, accordingly, the invention is not limited to a process of steps carried out in the explicit order recited.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope all such changes and modifications as are within the true spirit and scope of this invention.

What is claimed is:

1. A Schottky junction diode device, comprising:
    a substrate including substrate material of a first conductivity type and first dopant concentration;
    a first well, disposed in the substrate, including material of a second conductivity type and second dopant concentration, the second conductivity type opposite to the first conductivity type;
    a second well, disposed in the first well, including material of the first conductivity type and third dopant concentration;
    a second well contact within the second well, the second well contact comprising contact material of the first conductivity type and fourth dopant concentration higher than the first or the third dopant concentration;
    a region of metal-containing material disposed in the second well to form a Schottky junction at an interface between the region of metal-containing material and the second well;
    a third well, disposed in the substrate, including material of the first conductivity type and fifth dopant concentration lower than the fourth dopant concentration, wherein a portion of the substrate material of the first conductivity type and the first dopant concentration separates the third well and the first well to reduce capacitance of the Schottky junction diode device; and
    a third well contact within the third well, the third well contact comprising contact material of the first conductivity type and sixth dopant concentration higher than the fifth dopant concentration.

2. The device of claim 1, further comprising a first well contact included within the first well, the first well contact of the second conductivity type and a seventh dopant concentration higher than the second dopant concentration.

3. The device of claim 1, wherein the second well contact is formed in a closed loop shape which surrounds the Schottky junction.

4. The device of claim 3, wherein the closed loop shape is a rectangle.

5. The device of claim 2, wherein the first well contact is formed in a closed loop shape which surrounds the Schottky junction.

6. The device of claim 5, wherein the closed loop shape is a rectangle.

7. The device of claim 1, wherein the third well contact is formed in a closed loop shape which surrounds the Schottky junction.

8. The device of claim 7, wherein the closed loop shape is a rectangle.

9. The device of claim 1, wherein the substrate includes silicon.

10. The device of claim 1, wherein the substrate includes gallium arsenide.

11. The device of claim 1, wherein the region of metal-containing material comprises one or more of the materials selected from the group consisting of: titanium, titanium silicide, cobalt, cobalt silicide, nickel, nickel silicide, tungsten, tungsten silicide, gold, manganese, hafnium, silver, aluminum, palladium and platinum.

12. The device of claim 1, where the first dopant concentration is in an order of $10^{15}$ atoms of dopants per cubic centimeter.

13. The device of claim 1, wherein the second dopant concentration is in an order of $10^{17}$ atoms of dopants per cubic centimeter.

14. The device of claim 1, wherein the third dopant concentration is in an order of $10^{17}$ atoms of dopants per cubic centimeter.

15. The device of claim 1, wherein the fourth dopant concentration in an order of $10^{20}$ atoms of dopants per cubic centimeter.

16. The device of claim 1, wherein the fifth dopant concentration is in an order of $10^{17}$ atoms of dopants per cubic centimeter.

17. The device of claim 1, wherein the sixth dopant concentration is in an order of $10^{20}$ atoms of dopants per cubic centimeter.

18. The device of claim 1, wherein the device is manufactured using a standard Complementary Metal-Oxide-Semiconductor (CMOS) process.

19. The device of claim 1, wherein a bias signal to the substrate is applied via the third well.

20. A method for manufacturing a Schottky junction diode device, comprising:
    forming a substrate including substrate material of a first conductivity type and first dopant concentration;
    forming a first well, disposed in the substrate, including material of a second conductivity type and second dopant concentration, the second conductivity type opposite to the first conductivity type;
    forming a second well, disposed in the first well, including material of the first conductivity type and third dopant concentration;
    forming a second well contact within the second well, the second well contact comprising contact material of the first conductivity type and fourth dopant concentration higher than the first or the third dopant concentration;
    forming a region of metal-containing material disposed in the second well to form a Schottky junction at an interface between the region of metal-containing material and the second well;
    forming a third well disposed in the substrate and separated from the first well by a part of the substrate material of the first conductivity type and the first dopant concentration to reduce capacitance of the Schottky junction diode device, the third well including material of the first conductivity type and fifth dopant concentration lower than the fourth dopant concentration; and
    forming a third well contact within the third well, the third well contact comprising contact material of the first conductivity type and sixth dopant concentration higher than the fifth dopant concentration.

21. The method of claim 20, further comprising:
    forming a first well contact within the first well, the first well contact of the second conductivity and a seventh dopant concentration higher than the second dopant concentration.

22. The method of claim 20, wherein said forming a region of metal-containing material comprises utilizes one or more of the materials selected from the group consisting of: titanium, titanium silicide, cobalt, cobalt silicide, nickel, nickel silicide, tungsten, tungsten silicide, gold, manganese, hafnium, silver, aluminum, palladium and platinum to form the metal-containing region.

23. The method of claim 20, wherein said forming a second well contact includes forming the second well contact in a closed loop shape on a surface of the second well surrounding the region of metal-containing material.

24. The method of claim 23, wherein the closed loop shape is a rectangle.

25. The method of claim 20, wherein said forming a third well contact includes forming the third well contact in a closed loop shape on a surface of the third well surrounding the region of metal-containing material.

26. The method of claim 25, wherein the closed loop shape is a rectangle.

27. The method of claim 20, wherein the second dopant concentration is in an order of $10^{17}$ atoms of dopants per cubic centimeter.

28. The method of claim 20, wherein the third dopant concentration is in an order of $10^{17}$ atoms of dopants per cubic centimeter.

29. The method of claim 20, wherein the fourth dopant concentration in an order of $10^{20}$ atoms of dopants per cubic centimeter.

30. The method of claim 20, wherein the fifth dopant concentration is in an order of $10^{17}$ atoms of dopants per cubic centimeter.

31. The method of claim 20, wherein the sixth dopant concentration is in an order of $10^{20}$ atoms of dopants per cubic centimeter.

32. The method of clam 20, wherein the first well, forming the second well, forming the second well contact, forming the region of metal-containing material, forming the third well, and forming the third well contact are part of a standard Complementary Metal-Oxide-Semiconductor (CMOS) process.

33. The method of claim 20, wherein a bias signal to the substrate is applied via the third well.

* * * * *